US008441797B2

(12) United States Patent
Mochizuki

(10) Patent No.: US 8,441,797 B2
(45) Date of Patent: May 14, 2013

(54) MODULE CONNECTION STRUCTURE

(75) Inventor: Ryo Mochizuki, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 12/868,798

(22) Filed: Aug. 26, 2010

(65) Prior Publication Data

US 2011/0058343 A1     Mar. 10, 2011

(30) Foreign Application Priority Data

Sep. 8, 2009   (JP) .................................. 2009-207237
Aug. 20, 2010  (JP) .................................. 2010-185568

(51) Int. Cl.
*H05K 1/14*      (2006.01)

(52) U.S. Cl.
USPC ........................................................ 361/736

(58) Field of Classification Search .................. 333/128
See application file for complete search history.

(56) References Cited

U.S. PATENT DOCUMENTS

| 4,353,047 | A  | * | 10/1982 | Noguchi et al. ............... | 333/247 |
| 4,612,566 | A  | * | 9/1986  | Kowata et al. ................. | 257/728 |
| 5,978,666 | A  | * | 11/1999 | Faulkner et al. ............... | 455/327 |
| 6,239,384 | B1 | * | 5/2001  | Smith et al. .................... | 174/261 |
| 6,414,250 | B1 | * | 7/2002  | Inoue et al. .................... | 174/261 |
| 6,570,466 | B1 | * | 5/2003  | Bahl ............................... | 333/128 |
| 6,703,909 | B2 | * | 3/2004  | Miura et al. ................... | 333/128 |
| 6,704,207 | B2 | * | 3/2004  | Kopf .............................. | 361/760 |
| 6,787,710 | B2 | * | 9/2004  | Uematsu et al. .............. | 174/261 |
| 7,015,772 | B2 | * | 3/2006  | Ji .................................... | 333/128 |
| 7,030,715 | B2 | * | 4/2006  | Maeda et al. .................. | 333/128 |
| 7,603,097 | B2 | * | 10/2009 | Leblanc et al. ............... | 455/300 |
| 8,035,036 | B2 | * | 10/2011 | Jow et al. ....................... | 174/260 |
| 2003/0099097 | A1 | * | 5/2003 | Mok et al. ...................... | 361/767 |
| 2003/0159844 | A1 | * | 8/2003 | Wolf et al. ..................... | 174/35 R |
| 2003/0179558 | A1 | * | 9/2003 | Giaretta et al. ............... | 361/777 |

(Continued)

FOREIGN PATENT DOCUMENTS

| JP | 3-34272    | 2/1991 |
| JP | 4-264763   | 9/1992 |
| JP | 5-17567    | 3/1993 |
| JP | 5-95212    | 4/1993 |
| JP | 11-205012  | 7/1999 |
| JP | 2000-91802 | 3/2000 |

OTHER PUBLICATIONS

Official communication from Japanese Patent Office mailed Sep. 6, 2011, issued in counterpart patent application No. 2010-185568.

*Primary Examiner* — Lisa Lea Edmonds
*Assistant Examiner* — Xanthia C Cunningham
(74) *Attorney, Agent, or Firm* — Finnegan, Henderson, Farabow, Garrett & Dunner, LLP

(57) ABSTRACT

According to one embodiment, a module connection structure designed to connect a module to other modules. The module includes a dielectric layer, a micro-strip path, a projection, and a plurality of gain adjusting lands. The dielectric layer is formed on a substrate. The micro-strip path is provided on the dielectric layer and configured to transmit a transmission signal input to one end portion, to the other end portion. The projection is formed at edges of the substrate, which are adjacent to the other modules, and protruding from the micro-strip path and the dielectric layer toward the other modules. The plurality of gain adjusting lands is formed adjacent to the micro-strip path, for use in adjusting an input/output gain of the module. The gain adjusting lands uncouple from the micro-strip path or other gain adjusting lands couple to the micro-strip path, thereby to adjust the input/output gain of the module.

5 Claims, 4 Drawing Sheets

U.S. PATENT DOCUMENTS

| | | | |
|---|---|---|---|
| 2004/0022003 A1* | 2/2004 | Mazurkiewicz | 361/118 |
| 2004/0164407 A1* | 8/2004 | Nakajima et al. | 257/724 |
| 2004/0174231 A1* | 9/2004 | Maeda et al. | 333/128 |
| 2004/0223309 A1* | 11/2004 | Haemer et al. | 361/767 |
| 2005/0190012 A1* | 9/2005 | Ji | 333/128 |
| 2007/0023897 A1* | 2/2007 | Nakajima et al. | 257/728 |
| 2007/0028433 A1* | 2/2007 | Abbott et al. | 29/25.35 |
| 2007/0230145 A1* | 10/2007 | Yamamoto | 361/760 |
| 2009/0109584 A1* | 4/2009 | Jones et al. | 361/56 |
| 2009/0236134 A1* | 9/2009 | Knecht et al. | 174/260 |
| 2009/0243753 A1* | 10/2009 | Rofougaran | 333/128 |

\* cited by examiner

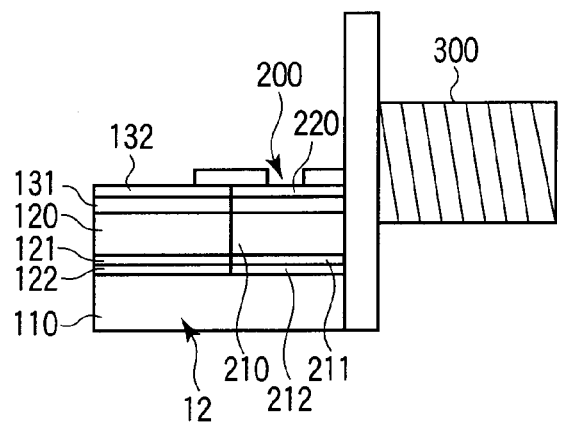
F I G. 4
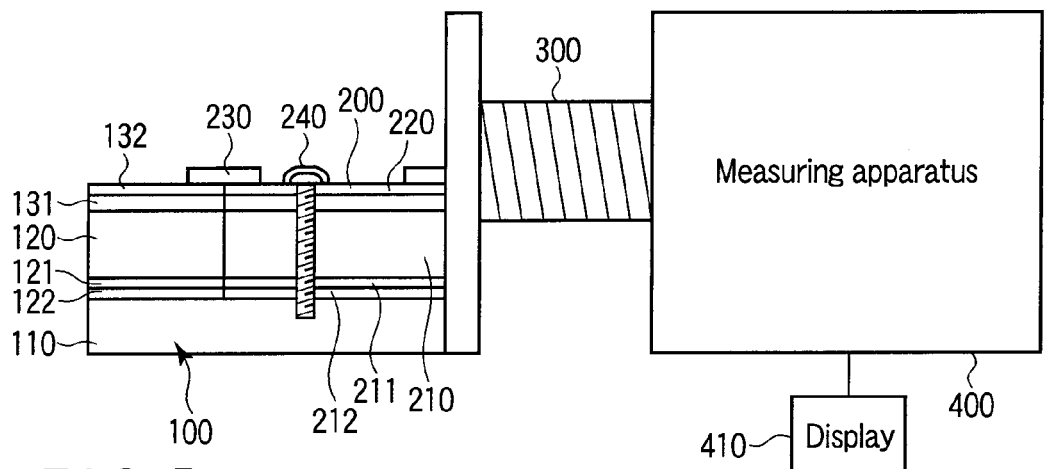
F I G. 5
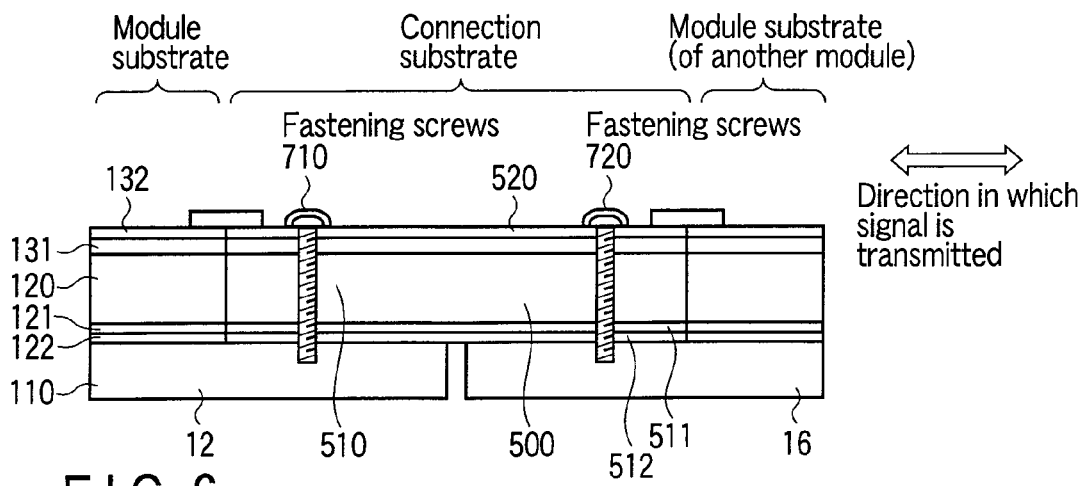
F I G. 6

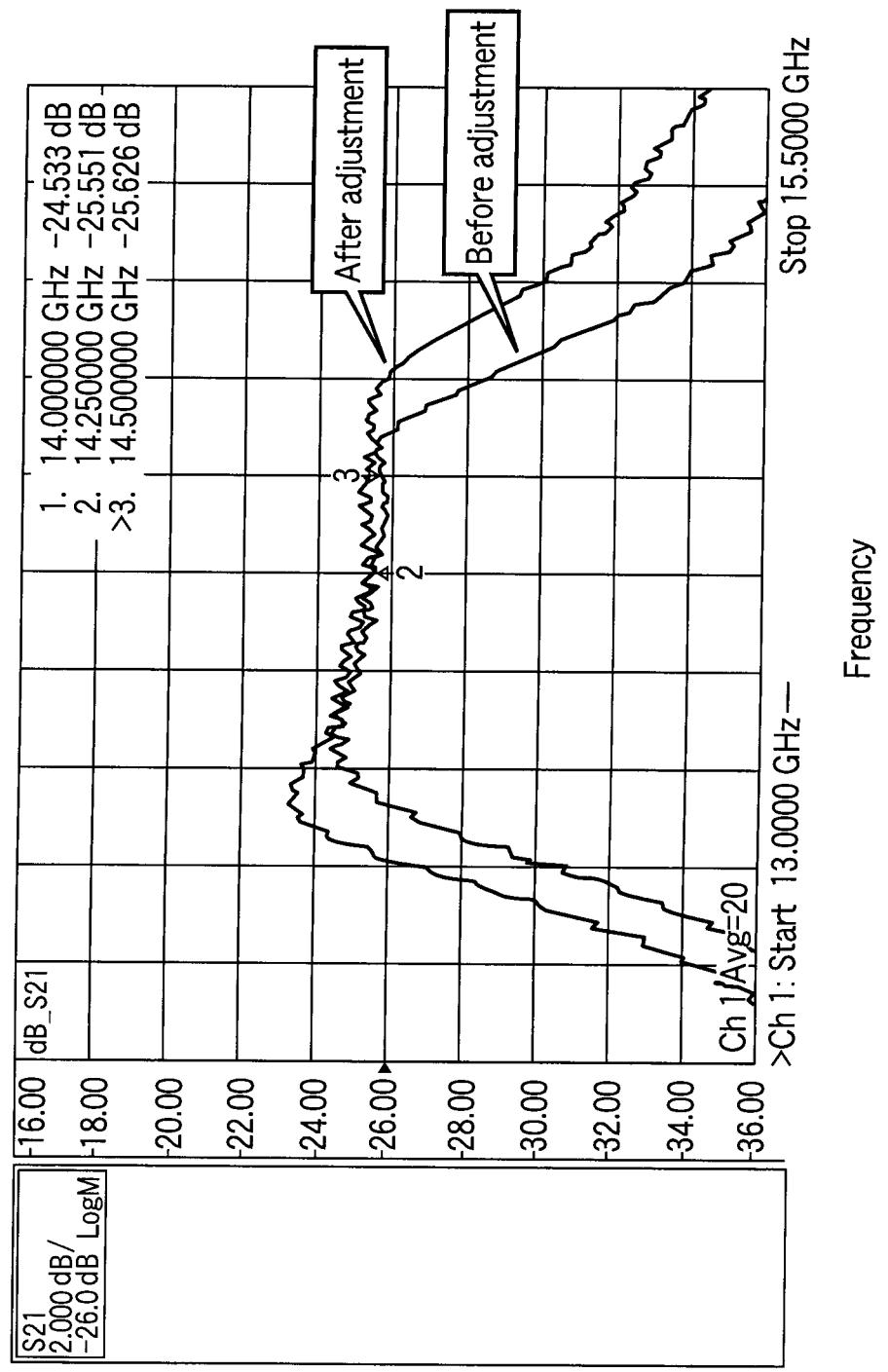
F I G. 8

MODULE CONNECTION STRUCTURE

CROSS-REFERENCE TO RELATED APPLICATIONS

This application is based upon and claims the benefit of priority from Japanese Patent Applications No. 2009-207237, filed Sep. 8, 2009; and No. 2010-185568, filed Aug. 20, 2010; the entire contents of both of which are incorporated herein by reference.

FIELD

Embodiments described herein relate generally to a module connection structure, for use in microwave communication apparatuses provided in, for example, a digital wireless communication/broadcasting system.

BACKGROUND

In any microwave communication apparatus provided in digital wireless communication system or broadcast system, many micro-strip paths are used in order to reduce the transmission loss of high-frequency power and to provide a circuit pattern well matched in impedance. (See, for example, Jpn. Pat. Appln. KOKAI Publication No. 11-205012 and Jpn. Pat. Appln. KOKAI Publication No. 3-34272. ) The micro-strip paths are signal lines, each comprising a dielectric layer and a copper foil. The dielectric layer is set to the ground potential. The copper foil is laid on the dielectric layer. An air layer is maintained above the substrate.

Examples of microwave communication apparatuses using micro-strip paths are a frequency converter and a power amplifier. Generally, each apparatus has a plurality of modules so that the circuits may be adjusted more easily than otherwise. The modules are first adjusted and then connected together, and therefore constitute an apparatus. The high-frequency line of each module may be changed in propagation mode and be provided as a coaxial connector such as SMA connector, and may therefore have an input/output interface. Alternatively, the high-frequency line of each module may be connected, as micro-strip path, to the high-frequency line of another module.

Of the microwave communication apparatuses, any apparatus in which an intense magnetic field concentrates at the circuit pattern, such as solid-state power amplifier of large power and extremely high frequency, will have a power loss due to transmission loss or reflection loss too large to neglect, if the propagation mode of the micro-strip paths is changed to that of a coaxial connector. Heat is inevitably generated in the apparatus, possibly damaging the circuit or degrading the coaxial connector characteristic. This is because the coaxial cable is insufficiently resistant to power.

This is why the modules are connected, usually by connecting the connection copper foils of the micro-strip paths. A uniform structure should therefore be provided, in which each micro-strip path has a dielectric layer set to the ground potential and a copper foil lies on the dielectric layer. Hitherto, however, that part of the dielectric layer, which lies at the connection part, changes to air, though for a very short distance. The ground distance inevitably changes. This mismatching results in an inductance component, which results in a gap that is too deep to neglect with respect to wavelength, particularly at high frequencies. The gap causes impedance mismatching between the lines. Consequently, trimming must be performed to eliminate the impedance mismatching.

BRIEF DESCRIPTION OF THE DRAWINGS

FIG. 4 is a sectional view showing an adjustment connection substrate and a connector, both connected to the module;

FIG. 5 is a sectional view, explaining how a measuring device adjusts the module according to the embodiment;

FIG. 6 is a sectional view of the module according to the embodiment, which is connected to another module by using a connection substrate;

FIG. 8 is a diagram explaining the input/output characteristic a module has before adjusted and the input/output characteristic the module has after adjusted.

DETAILED DESCRIPTION

In general, according to one embodiment, a module connection structure designed to connect a module to other modules. The module includes a dielectric layer, a micro-strip path, a projection, and a plurality of gain adjusting lands. The dielectric layer is formed on a substrate. The micro-strip path is provided on the dielectric layer and configured to transmit a transmission signal input to one end portion, to the other end portion. The projection is formed at edges of the substrate, which are adjacent to the other modules, and protruding from the micro-strip path and the dielectric layer toward the other modules. The plurality of gain adjusting lands is formed adjacent to the micro-strip path, for use in adjusting an input/output gain of the module. Some or all of the gain adjusting lands may be uncouple from the micro-strip path or other gain adjusting lands may be couple to the micro-strip path, as open stubs for the micro-strip path, thereby to adjust the input/output gain of the module.

Figure 1:
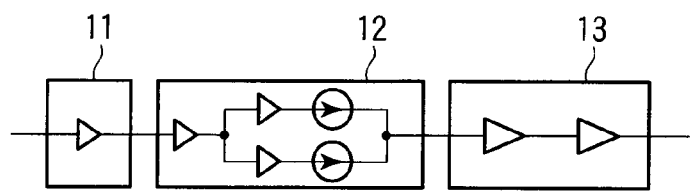
FIG. 1 is a block diagram showing the major components of a high-frequency amplifier using modules according to an embodiment.

FIG. 1 is a block diagram showing the major components of a high-frequency amplifier using modules according to the embodiment. In the high-frequency amplifier, a transmission signal of radio frequency (RF) band is supplied via an input module 11 to a power amplifier module 12. The power amplifier module 12 amplifies the RF signal with a given gain. The signal thus amplified is output to an output module 13.

Figure 2:
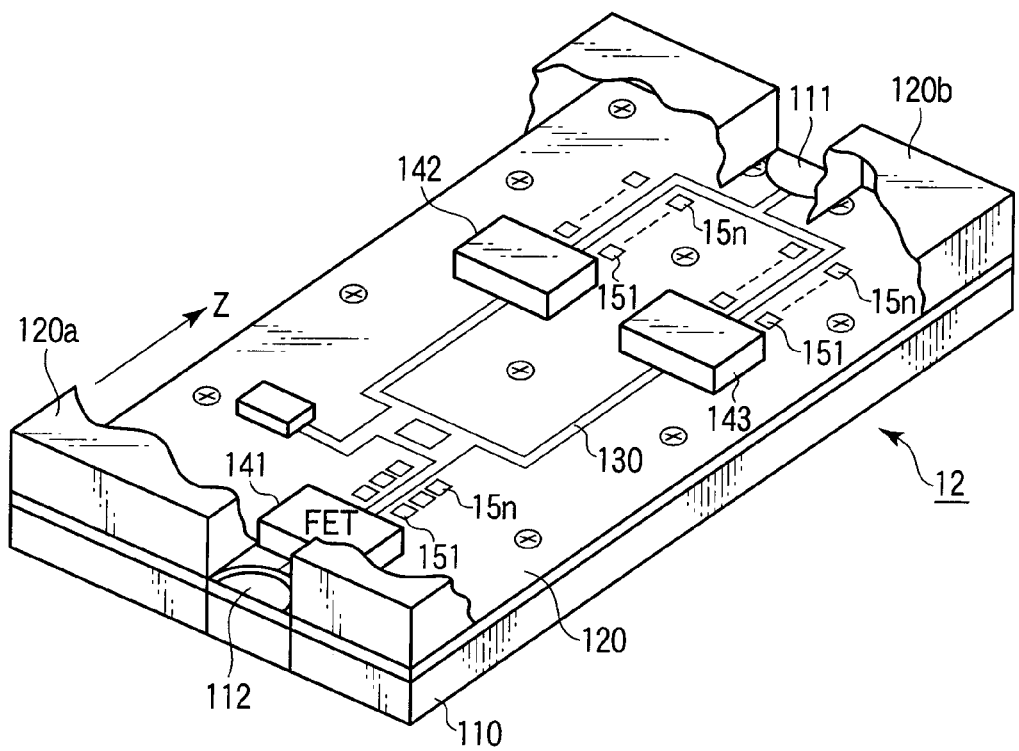
FIG. 2 is a perspective view of a power amplifier module according to the embodiment.
Figure 3:
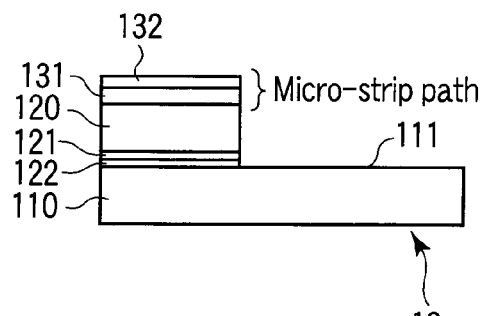
FIG. 3 is a sectional view of the power amplifier module, as viewed from a side.

FIG. 2 is a perspective view of the power amplifier module 12 according to the embodiment. FIG. 3 is a sectional view of the power amplifier module 12, as viewed from a side.

The power amplifier module 12 comprises a base plate 110 and a dielectric layer 120 laid on the base plate (i.e. substrate) 110. On the dielectric layer 120, a micro-strip path 130 is formed. The micro-strip path 130 has been formed by first laying a copper foil 131 on the dielectric layer 120 and then laying a gold layer 132 on the copper foil 131 by means of electroplating. The signal is transmitted through the micro-strip path 130 in direction Z, as shown in FIG. 2. Under the dielectric layer 120, a copper foil 121 and a gold layer 122 are formed.

Outer-upper layers 120a and 120b, both made of aluminum or like, are provided on the dielectric layer 120, surrounding the micro-strip path 130. Outer-upper layers 120a and 120b are set to the ground potential.

The power amplifier module 12 has two projections 111 and 112. The projection 111 extends from the dielectric layer 120 and micro-strip path 130 toward the input module 11 (FIG. 1). The projection 112 extends from the dielectric layer 120 and micro-strip path 130 toward the output module 13 (FIG. 1). The projections 111 and 112 have been formed by cutting away parts of the dielectric layer 120 and micro-strip path 130.

On the micro-strip path 130, field-effect transistors (FETs) 141 to 143 are arranged to amplify the transmission signal with a given gain. Gain adjusting lands 151 to 15n made of copper foil are formed at the input and output parts of the micro-strip path 130, in order to adjust the input/output gains of the FETs 141 to 143, respectively.

As shown in FIG. 4, an adjustment connection substrate 200 is removably connected to the projections 111 and 112. Like the power amplifier module 12, the adjustment connection substrate 200 is composed of a dielectric layer 210 and a micro-strip path 220 having the same width as the micro-strip path 130. The adjustment connection substrate 200 is so designed that the micro-strip path 130 and micro-strip path 220 are connected to the projection 111. The micro-strip path 130 and micro-strip path 220 are connected through a copper foil 230 using cream solder or a soldering pot.

The open end portion of the adjustment connection substrate 200 is connected to a connector 300. More precisely, the substrate 200 is secured to the power amplifier module 12, with screws 240, as is shown in FIG. 5.

As shown in FIG. 5, too, a measuring apparatus 400 is connected to the connector 300. The measuring apparatus 400 measures the signal transmitted through the micro-strip path 130 and micro-strip path 220. More precisely, the measuring apparatus 400 measures the gain characteristics of the input and output of, for example, the power amplifier module 12. A display 410 displays the output of the measuring apparatus 400, e.g., the gain characteristic of the power amplifier module 12.

While looking at the display 410, the person in charge of adjustment may uncouple the gain adjusting lands 151 to 15n used as an open stub, jointly with the micro-strip path 130, from the micro-strip path 130, or may couple the gain adjusting lands 151 to 15n, as an open stub, to the micro-strip path 130. The input/output gain of the power amplifier module 12 is thereby adjusted.

After the input/output gain of the power amplifier module 12 has been adjusted in accordance with the output of the measuring apparatus 400, the substrate 200 and the connector 300 are removed from the power amplifier module 12. Thereafter, a connection substrate 500 connects the power amplifier module 12 to the output module 13, as shown in FIG. 6. The output module 13 is made of the same material and has the same structure, as the power amplifier module 12. Hence, it has the same impedance as the power amplifier module 12.

The connection substrate 500 is composed of a dielectric layer 510 and a micro-strip path 520. The micro-strip path 520 has the same width as a micro-strip path 130. The connection substrate 500 therefore connects the micro-strip path 130 and micro-strip path 520 to the projection 111. The output module 13 has a structure similar to that of the power amplifier module 12. FIG. 6 is a sectional view of the power amplifier module 12 and output module 13 as viewed from a side, which are connected to each other by the connection substrate 500. As shown in FIG. 6, the connection substrate 500 is secured to the power amplifier module 12 and output module 13, with fastening screws 710 and 720.

How the modules are connected by using the structure described above will be explained.

In this embodiment, the power amplifier module 12 and connection substrate 500 are made of the same material and have the configuration. Therefore, they can be connected without changing the pattern width of the signal path set to prescribed impedance. A change in pattern width at any part of the signal path will inevitably increase both the transmission loss and reflection loss.

Figure 7:
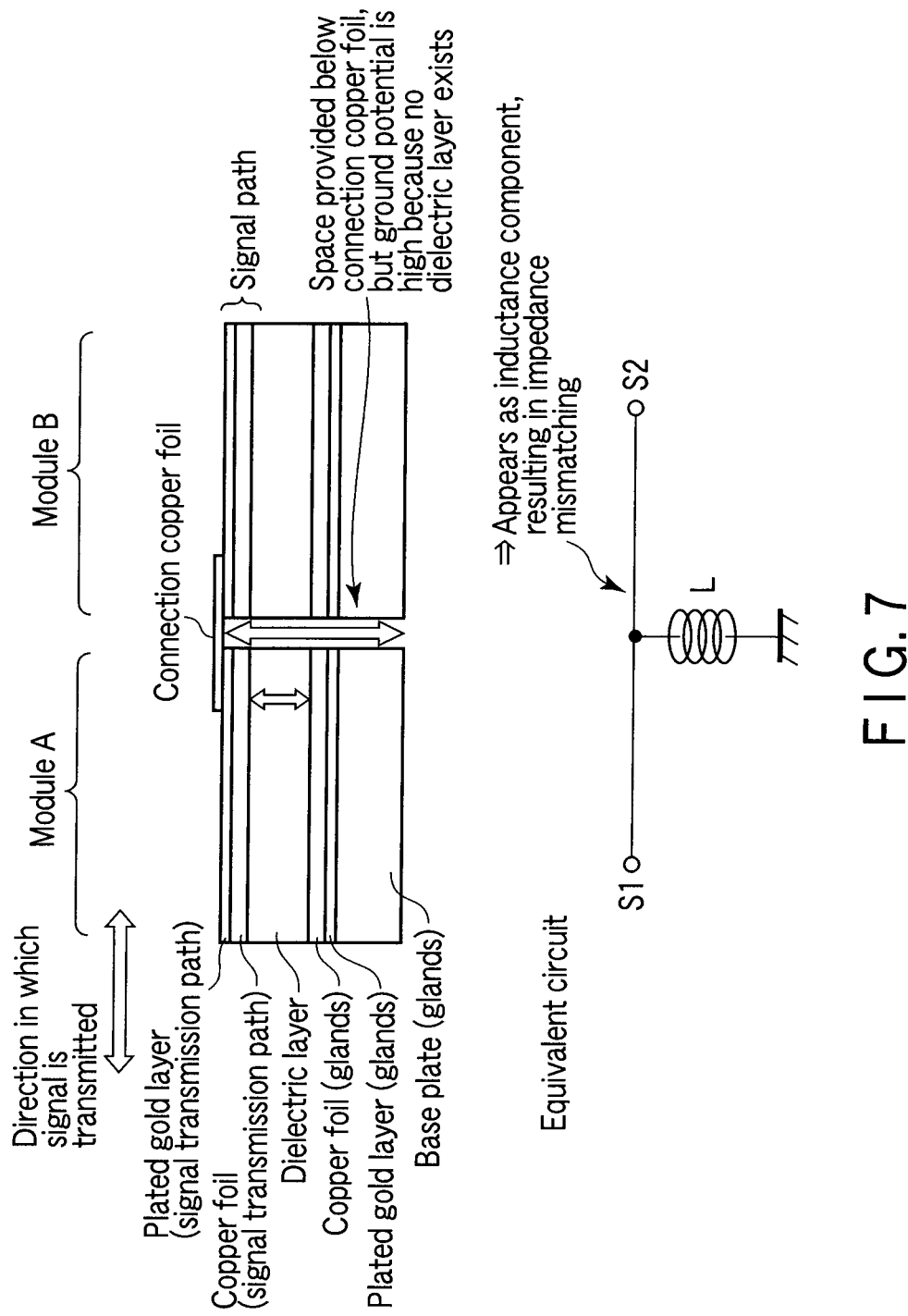
FIG. 7 is a diagram explaining how modules are connected by a conventional method.

Hitherto, however firmly two modules set into mutual contact, the "trench" remote from the ground potential is observed, as shown in FIG. 7. An inductance component L of high-frequency exists at the path junction, inevitably decreasing the transmission loss and the reflection loss. In this embodiment, the connection substrate 500 is fastened to the base plate, together with the power amplifier module 12 and output module 13, by means of the screws that are driven in the screw holes made in the four corners of the base plate. The copper foil 511 and plated gold layer 512, both on the lower side of the connection substrate 500, firmly contact the base plate 110 of the power amplifier module 12 and are set to the ground potential. Therefore, the copper foil 511 and the plated gold layer 512, both at the lower side of the substrate 500, prevent the generation of an electrical "trench" of the inductance component at the time of coupling the modules.

In this embodiment, the adjustment connection substrate 200 has the same dielectric constant, the same thickness, the same copper foil thickness, and the same gold layer thickness as the modules and which holds the micro-strip path 220 having the same path width as the modules. Using this substrate 200, the connector 300 is secured to the power amplifier module 12. The adjustment connection substrate 200 is half as long as the connection substrate 500. Like the connection substrate 500, the adjustment connection substrate 200 is fastened with the screws driven in the screw holes made in the two corners, together with the base plate 110 of the power amplifier module 12. Therefore, the copper foil 211 and plated gold layer 212, both on the lower side of the connection substrate 200, firmly contact the base plate 110 of the power amplifier module 12 and are set to the ground potential. Thus, the copper foil and the plate gold layer have the same structure as the substrate, in terms of high frequency. The input and output of the power amplifier module 12 can therefore be easily connected to the measuring apparatus 400 in this embodiment. Hence, the modules can be adjusted as easily as in the conventional method.

In order to adjust the gain of, for example, the power amplifier module 12, the person in charge of adjustment may first connect the adjustment connection substrate 200 and the connector 300 to the projection 111 of the power amplifier module 12 and then attach the measuring apparatus 400 to the connector 300. In this case, the measuring apparatus 400 receives the data necessary for this person to adjust the gain of the power amplifier module 12.

That is, the person may use the input unit (not shown), inputting the data for adjusting the gain to the measuring apparatus 400. The data is displayed by the display 410 connected to the measuring apparatus 400. The display 410 also displays the input/output gain characteristic the power amplifier module 12 had before it was adjusted. In this instance, the gain achieved ranges from 13.25 GHz to 15 GHz.

Then, the person in charge of adjustment looks the data displayed on the display 410, and may uncouple the gain adjusting lands 151 to 15n from the micro-strip path 130 or may couple the gain adjusting lands 151 to 15n to the micro-strip path 130. The input/output gain of the power amplifier module 12 is thereby adjusted.

As a result, the gain of the power amplifier module 12 can be adjusted, as shown in FIG. 8, to a desirable value in a band (13 GHz to 15.5 GHz) broader than the band possible with the input/output gain characteristic the power amplifier module 12 had before adjusted.

Now that the power amplifier module 12 has been adjusted in terms of input/output gain characteristic, by using the measuring apparatus 400, the adjustment connection substrate 200 and the connector 300 are detached from the power amplifier module 12. Thereafter, the power amplifier module 12 is connected to the output module 13, by the connection substrate 500.

In this embodiment, the power amplifier module 12 has the projections 111 and 112, which protrude, as described above, from the dielectric layer 120 and the micro-strip path 130, respectively, to the input module 11 and output module 13, both provided on the base plate 110. Further, the gain adjusting lands 151 to 15n are formed on both sides of the micro-strip path 130, in order to adjust the input/output gains of each module. Some of the gain adjusting lands 151 to 15n may be uncouple from the micro-strip path 130, or other gain adjusting lands may be couple to the micro-strip path 130, as open stubs for the micro-strip path 130, thereby to adjust the input/output gain of each module.

The input/output gain of each module can thus adjusted before the module is connected to any other module.

In the embodiment described above, the adjustment connection substrate 200 of the same structure as the power amplifier module 12 is connected to the projection 111 of the base plate 110, thereby connecting the micro-strip paths 130 and 220 to each other and connecting the connector 300 for the measuring apparatus 400 to the open edge of the adjustment connection substrate 200. The transmission signal can therefore be supplied to the measuring apparatus 400 and be measured by the measuring apparatus 400. The input/output gain of each module can thereby be adjusted easily. In addition, the impedance mismatching at the junction of the micro-strip paths 130 can be reduced, ultimately increasing the transmission loss and reflection loss in the circuit.

In the embodiment described above, the projections 111 and 112 have been formed by cutting way a part of the dielectric layer 120 and a part of the micro-strip paths 130, respectively. The modules can be connected to one another by one connection substrate 500, even if they differ in size.

How the power amplifier module 12 is connected to the output module 13 has been explained, in describing the embodiment. The power amplifier module 12 can, nonetheless, be connected to the input module 11 in the same manner.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A module connection structure designed to connect a module to other modules, the module comprising:
   a dielectric layer formed on a substrate;
   a micro-strip path provided on the dielectric layer and configured to transmit a transmission signal input to one end portion, to the other end portion;
   a plurality of elements provided on the micro-strip path;
   a projection formed at edges of the substrate, which are adjacent to the other modules, and protruding from the micro-strip path and the dielectric layer toward the other modules; and
   a plurality of gain-adjusting lands formed above the substrate, adjacent to the micro-strip path, and coupleable to the micro-strip path, for use in adjusting an input/output gain of the module.

2. The module connection structure according to claim 1, wherein the dielectric layer is a first dielectric layer and the micro-strip is a first micro-strip, the module connection structure further comprising:
   a connection substrate including a second dielectric layer and a second micro-strip path having the same width as the first micro-strip path, the connection substrate connected to the projection, thereby to connect the micro-strip paths to each other; and
   a connector connected to an open end portion of the connection substrate and connected to a measuring apparatus for measuring the transmission signal transmitted through the micro-strip paths.

3. The module connection structure according to claim 2, wherein the connection substrate is capable of being attached and detached to and from the projection.

4. The module connection structure according to claim 2, wherein after the input/output gain of the module is adjusted in accordance with a value measured by the measuring apparatus, the connection substrate and the connector are removed, and the module is connected to another module.

5. The module connection structure according to claim 1, wherein the projection is formed by cutting away at least parts of the micro-strip path and dielectric layer.

* * * * *